US010142524B2

(12) United States Patent
Wu et al.

(10) Patent No.: US 10,142,524 B2
(45) Date of Patent: Nov. 27, 2018

(54) CAMERA ASSEMBLY AND ELECTRONIC DEVICE

(71) Applicant: Beijing Xiaomi Mobile Software Co., Ltd., Haidian District, Beijing (CN)

(72) Inventors: Fenghui Wu, Beijing (CN); Kesheng Yan, Beijing (CN)

(73) Assignee: BEIJING XIAOMI MOBILE SOFTWARE CO., LTD., Haidian District, Beijing (CN)

( * ) Notice: Subject to any disclaimer, the term of this patent is extended or adjusted under 35 U.S.C. 154(b) by 21 days.

(21) Appl. No.: 15/394,859

(22) Filed: Dec. 30, 2016

(65) Prior Publication Data
US 2017/0251131 A1    Aug. 31, 2017

(30) Foreign Application Priority Data

Feb. 29, 2016  (CN) .......................... 2016 1 0112889

(51) Int. Cl.
*H04N 5/225* (2006.01)
*G06F 1/16* (2006.01)
(Continued)

(52) U.S. Cl.
CPC ............. *H04N 5/2252* (2013.01); *G03B 5/00* (2013.01); *G03B 17/02* (2013.01); *G03B 17/12* (2013.01); *G06F 1/1624* (2013.01); *G06F 1/1677* (2013.01); *G06F 1/1683* (2013.01); *H04M 1/0237* (2013.01); *H04M 1/0264* (2013.01); *H04N 5/2253* (2013.01);
(Continued)

(58) Field of Classification Search
CPC ........................... G03B 11/041; G03B 1/1656
See application file for complete search history.

(56) References Cited

U.S. PATENT DOCUMENTS 7,557,851 B2 *  7/2009  Ohashi ............... H04M 1/0214
                                                        348/333.06
2008/0002965 A1  1/2008  Huang et al.
2008/0085112 A1  4/2008  Lane et al.

FOREIGN PATENT DOCUMENTS

CN    101047784 A    10/2007
CN    202309797 U     7/2012
(Continued)

OTHER PUBLICATIONS

Extended European Search Report of European Patent Application No. 17153912.5, from the European Patent office, dated Jul. 6, 2017.
(Continued)

*Primary Examiner* — Christopher K Peterson
(74) *Attorney, Agent, or Firm* — Jun He Law Offices P.C.; James J. Zhu

(57) ABSTRACT

A camera assembly and an electronic device are provided. The camera assembly includes a housing having a first sliding groove; a camera component provided inside the housing and slidable along the first sliding groove, wherein the camera component is configured to switch between a first state and a second state by the guide of the PUSH-PUSH component when receiving a press operation; and a press-type PUSH-PUSH component provided inside the housing, wherein both ends of the PUSH-PUSH component are connected to the housing and the camera component, respectively.

20 Claims, 6 Drawing Sheets

(51) Int. Cl.
*H04M 1/02* (2006.01)
*H05K 1/02* (2006.01)
*G03B 17/12* (2006.01)
*G03B 5/00* (2006.01)
*G03B 17/02* (2006.01)
*H05K 1/11* (2006.01)

(52) U.S. Cl.
CPC .............. *H05K 1/0283* (2013.01); *H05K 1/11* (2013.01); *G03B 2205/0092* (2013.01); *G03B 2217/002* (2013.01); *H05K 2201/055* (2013.01); *H05K 2201/10121* (2013.01)

(56) References Cited

FOREIGN PATENT DOCUMENTS

| | | |
|---|---|---|
| CN | 203272594 U | 11/2013 |
| CN | 105676963 A | 6/2016 |

OTHER PUBLICATIONS

International Search Report of PCT/CN2016/101303.

\* cited by examiner

CAMERA ASSEMBLY AND ELECTRONIC DEVICE

CROSS-REFERENCE TO RELATED APPLICATIONS

The application is based upon and claims priority to Chinese Patent Application No. 201610112889.1, filed on Feb. 29, 2016, the entire contents of which are incorporated herein by reference.

TECHNICAL FIELD

The present disclosure relates to the field of mechanical design, and more particularly to a camera assembly and an electronic device.

BACKGROUND

A camera assembly is a common assembly in an electronic device such as a handset, a tablet computer, a notebook computer or the like. The camera assembly is used for acquiring an image or video.

The camera assembly is usually provided on the back side of an electronic device. Since the back side of the electronic device often contacts a table, the lens of the camera assembly tends to be worn and torn. Typically, a sapphire lens is provided for the camera assembly so as to reduce the wear and tear.

SUMMARY

The present disclosure provides a camera assembly and an electronic device as follow.

According to a first aspect of embodiments of the present disclosure, a camera assembly is provided. The camera assembly includes: a housing having a first sliding groove; a camera component provided inside the housing and slidable along the first sliding groove, wherein the camera component is configured to switch between a first state and a second state by the guide of the PUSH-PUSH component when receiving a press operation; and a press-type PUSH-PUSH component provided inside the housing, wherein both ends of the PUSH-PUSH component are connected to the housing and the camera component, respectively.

According to a second aspect of embodiments of the present disclosure, an electronic device is provided. The electronic device includes: a main board and a camera assembly provided on the main board. The camera assembly includes: a housing having a first sliding groove; a camera component provided inside the housing and slidable along the first sliding groove, wherein the camera component is configured to switch between a first state and a second state by the guide of the PUSH-PUSH component when receiving a press operation; and a press-type PUSH-PUSH component provided inside the housing, wherein both ends of the PUSH-PUSH component are connected to the housing and the camera component, respectively.

It is to be understood that both the foregoing general description and the following detailed description are exemplary only and are not restrictive of the present disclosure.

BRIEF DESCRIPTION OF THE DRAWINGS

The accompanying drawings, which are incorporated in and constitute a part of this specification, illustrate embodiments consistent with the disclosure and, together with the description, serve to explain the principles of the disclosure.

DETAILED DESCRIPTION

Here, exemplary embodiments will be described in detail, examples of which are illustrated in the accompanying drawings. The following description refers to the accompanying drawings in which the same or similar numbers in different drawings represent the same or similar elements unless otherwise indicated. The implementations set forth in the following description of exemplary embodiments do not represent all implementations consistent with the present disclosure. Instead, they are merely examples of apparatuses and methods consistent with aspects related to the present disclosure as recited in the appended claims.

Figure 1:
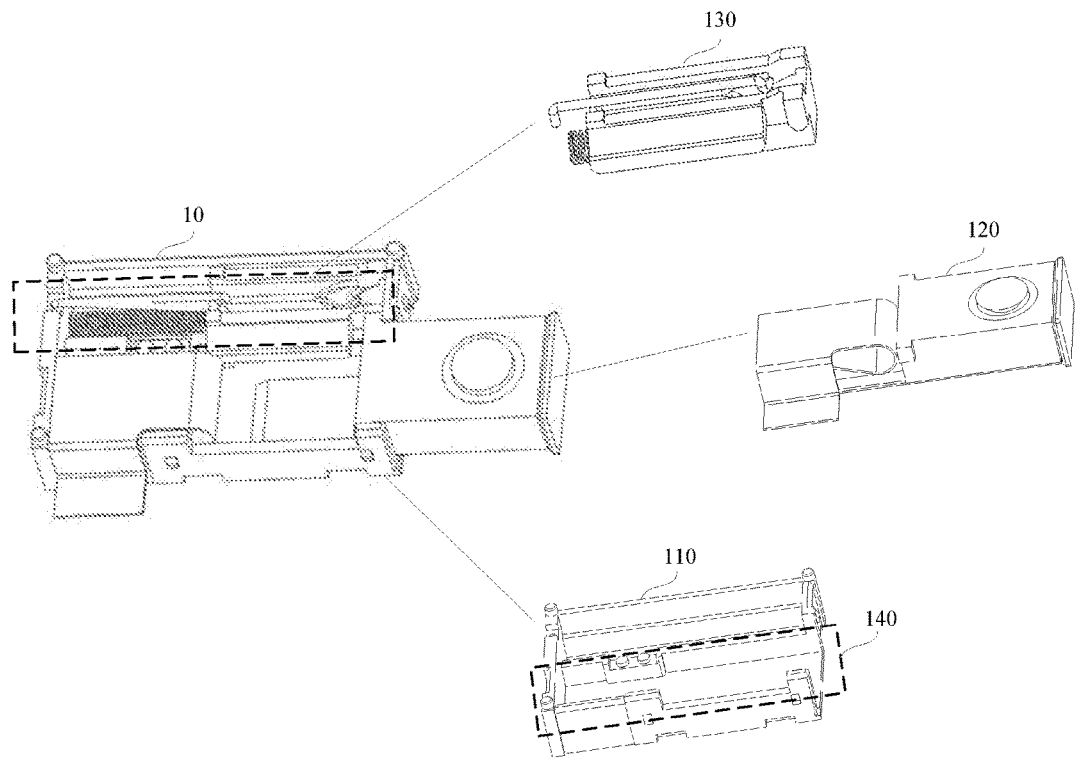
FIG. 1 is a schematic structural diagram of a camera assembly according to an exemplary embodiment.

FIG. 1 is a schematic structural diagram of a camera assembly according to an exemplary embodiment. The camera assembly may be a camera assembly in an electronic device such as a handset, a tablet computer, a notebook computer or the like. As shown in FIG. 1, a camera assembly 10 includes: a housing 110, a camera component 120 provided inside the housing 110 and a PUSH-PUSH (press-type) component 130 provided inside the housing 110.

One end of the PUSH-PUSH component 130 is connected to the housing 110 and the other end thereof is connected to the camera component 120.

A first sliding groove 140 is formed inside the housing 110 for the camera component 120 to slide.

The camera component 120 is configured to, when receiving a press operation, switch between a first state of protruding from the housing 110 and a second state of retracting inside the housing 110 under the guidance of the PUSH-PUSH component 130.

Figure 1A:
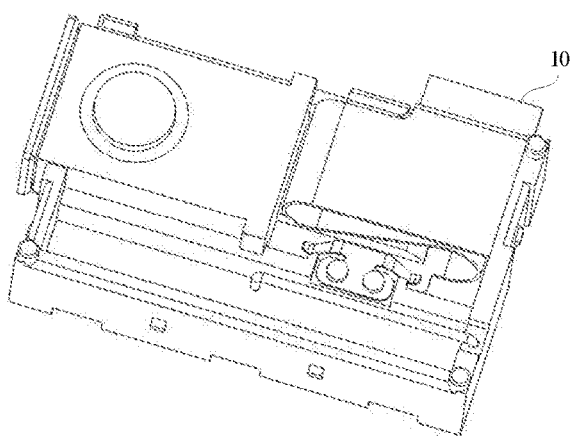
FIG. 1A is a schematic diagram illustrating a state of a camera assembly according to an exemplary embodiment.

FIG. 1 is a schematic diagram of the camera assembly 10 when the camera component 120 is in the first state, and FIG. 1A is a schematic diagram of the camera assembly 10 when the camera component 120 is in the second state (the PUSH-PUSH component 130 is not shown in FIG. 1A).

The camera assembly provided in the above embodiment of the present disclosure includes: a housing having a first sliding groove; a camera component provided inside the housing and slidable along the first sliding groove, wherein the camera component is configured to switch between a first state and a second state by the guide of the PUSH-PUSH component when receiving a press operation; and a press-type PUSH-PUSH component provided inside the housing, wherein both ends of the PUSH-PUSH component are connected to the housing and the camera component, respectively. Thus, even if the camera assembly is provided on the back side of an electronic device and the back side of the electronic device often contacts a table, the lens of the camera assembly is not easy to be worn. That is, as the lens of the camera assembly in the above embodiment can be switched between protruding from the housing and retracting inside the housing, not only the usage of the camera assembly will not be affected but also the wear and tear of the lens can be reduced.

Figure 2:
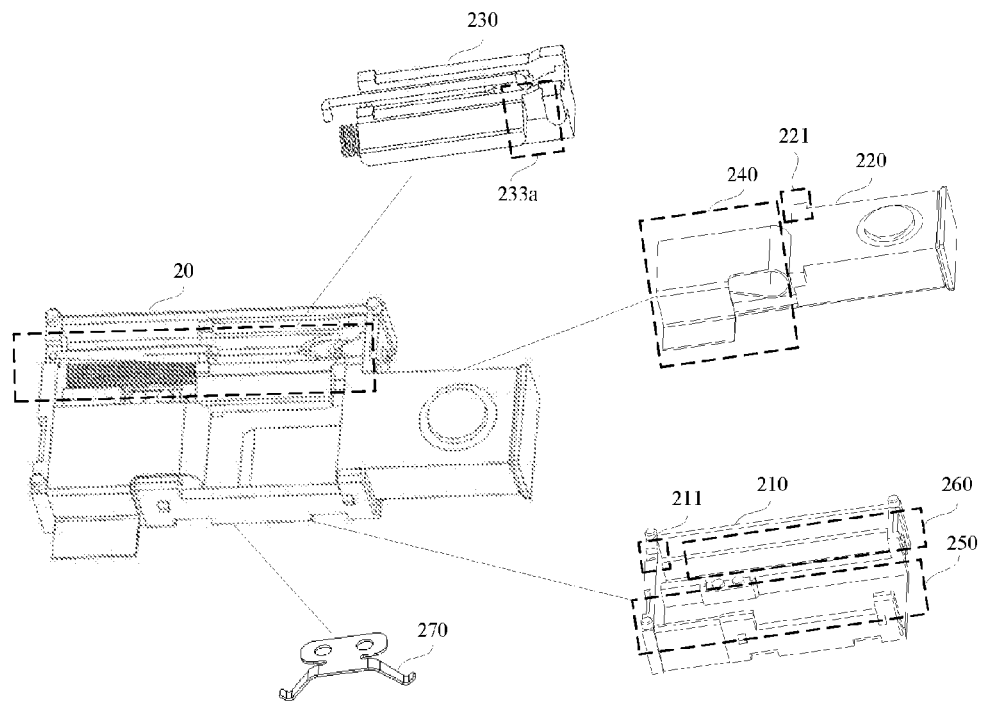
FIG. 2 is a schematic structural diagram of a camera assembly according to another exemplary embodiment.

FIG. 2 is a schematic structural diagram of a camera assembly according to an exemplary embodiment. The camera assembly may be a camera assembly in an electronic device such as a handset, a tablet computer, a notebook computer or the like. As shown in FIG. 2, a camera assembly 20 includes: a housing 210, a camera component 220 provided inside the housing 210 and a PUSH-PUSH component 230 provided inside the housing 210.

In an embodiment, the camera assembly 20 further includes a flexible printed circuit board 240.

In an embodiment, one end of the flexible printed circuit board 240 is electrically connected to the camera component 220 and the other end thereof is connected to a processor.

One end of the PUSH-PUSH component 230 is connected to the housing 210 and the other end thereof is connected to the camera component 220.

In an embodiment, the housing 210 is of a cuboid shape, and the camera component 220 and the PUSH-PUSH component 230 are provided inside the housing in parallel. The shape of the housing is not limited in this embodiment.

Figure 2A:
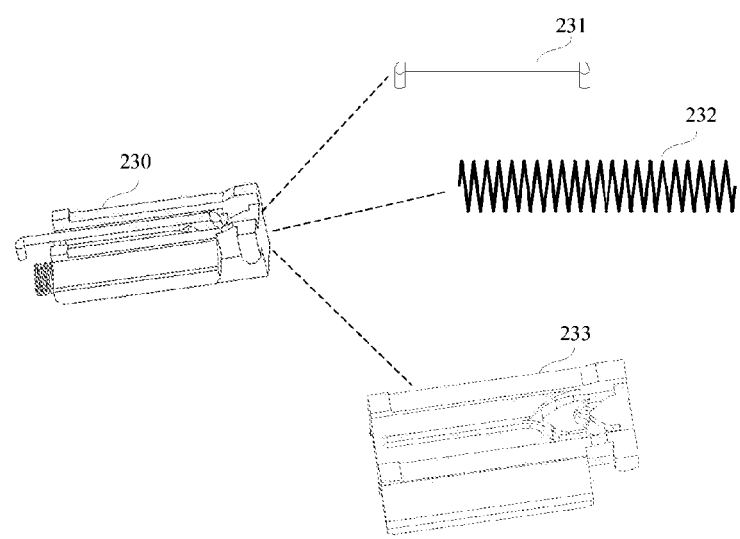
FIG. 2A is a schematic structural diagram of a camera assembly according to another exemplary embodiment.

In an embodiment, the PUSH-PUSH component 230 includes a hook element 231, an elastic component 232 and a heart-shaped sliding groove 233, as shown in FIG. 2A.

In an embodiment, the elastic component 232 is a spring.

Figure 2B:
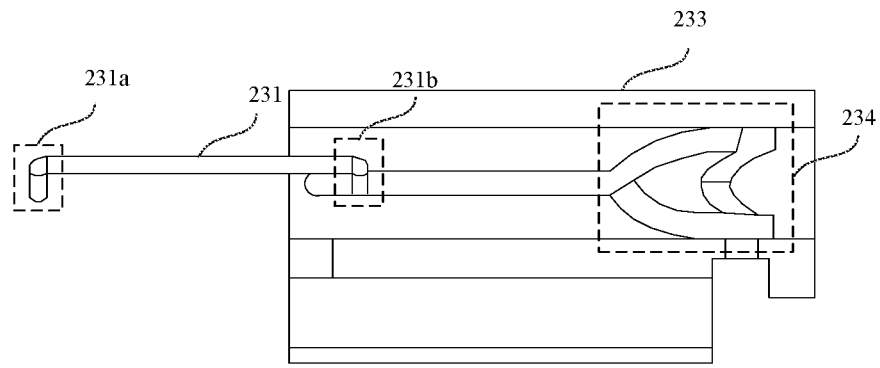
FIG. 2B is a schematic structural diagram of a camera assembly according to another exemplary embodiment.

The tail 231a of the hook element 231 is connected to the housing 210, and the hook head 231b of the hook element 231 is disposed in the heart-shaped sliding groove 233, as shown in FIG. 2B.

In an embodiment, the tail 231a and the hook head 231b of the hook element 231 each are of a curved shape so that the tail 231a of the hook element 231 is disposed in a small hole 211 of the housing 210 and connected to the housing.

In an embodiment, the tail 231a of the hook element 231 is connected to the housing 210 at a fixed location, and the hook head 231b is disposed inside the heart-shaped sliding groove 233 and is movable to the left or right.

A first sliding groove 250 is formed inside the housing 210 for the camera component 220 to slide therealong.

In an embodiment, the camera component 220 is provided in the first sliding groove 250 and can slide along the first sliding groove 250.

In an embodiment, a second sliding groove 260 is further provided inside the housing 210 for the heart-shaped sliding groove 233 to slide therealong, and the second sliding groove 260 and the first sliding groove 250 are provided in parallel.

In an embodiment, the heart-shaped sliding groove 233 is provided in the second sliding groove 260 and can slide along the second sliding groove 260.

In an embodiment, a recess 233a of the heart-shaped sliding groove 233 and a projection 221 of the camera component 220 are engaged fixedly in parallel so that the other end of the PUSH-PUSH component 230 is connected to the camera component 220. The method and the location for engaging the camera component 220 and the heart-shaped sliding groove 233 are not limited in this embodiment.

In an embodiment, the sliding direction of the heart-shaped sliding groove 233 is the same as that of the camera component 220.

The heart-shaped sliding groove 233 includes a heart-shaped closed sliding groove 234. The shape of the closed sliding groove 234 is not limited in this embodiment.

Figure 2C:
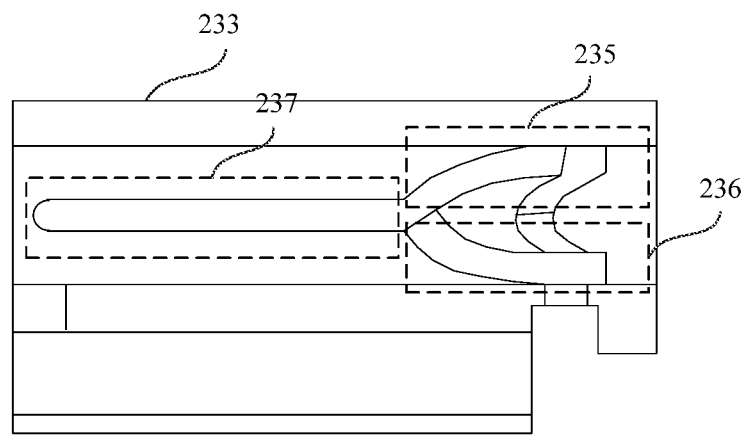
FIG. 2C is a schematic structural diagram of a camera assembly according to another exemplary embodiment.

In an embodiment, the closed sliding groove 234 includes a first arch sliding groove 235 and a second arch sliding groove 236, as shown in FIG. 2C.

In an embodiment, the heart-shaped sliding groove 233 further includes a third sliding groove 237 which is connected to the closed sliding groove 234. Specifically, the third sliding groove 237 is connected to the tail end of the first arch sliding groove 235 and the tail end of the second arch sliding groove 236.

Figure 2D:
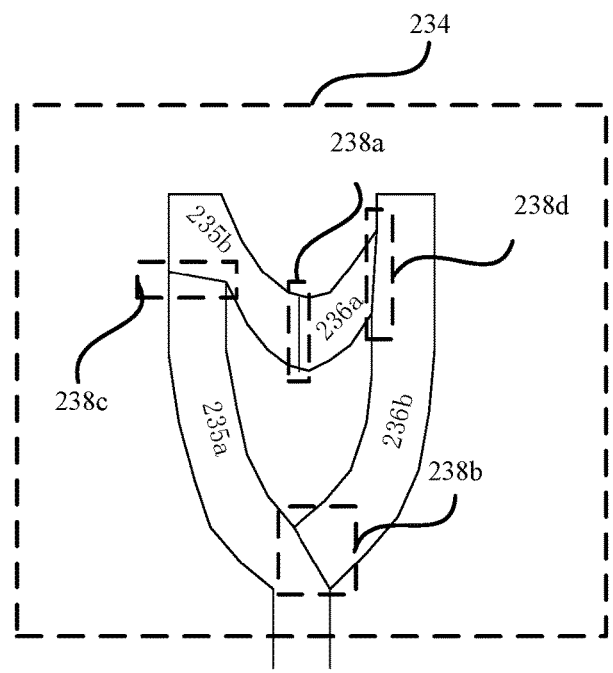
FIG. 2D is a schematic structural diagram of a camera assembly according to another exemplary embodiment.

In an embodiment, the first top end of the first arch sliding groove 235 and the second top end of the second arch sliding groove 236 meet to form a first recess 238a, as shown in FIG. 2D; and at the intersection, the first top end of the first arch sliding groove 235 is higher than the second top end of the second arch sliding groove 236.

In an embodiment, the first tail end of the first arch sliding groove 235 and the second tail end of the second arch sliding groove 236 meet to form a second recess 238b; and at the intersection, the second tail end of the second arch sliding groove 236 is higher than the first tail end of the first arch sliding groove 235.

In an embodiment, if the third sliding groove 237 exists, when the hook head 231b moves to the second recess 238b, it continues to slide into the third sliding groove 237.

In an embodiment, the first arch sliding groove 235 includes a first curved sliding groove 235a and a second curved sliding groove 235b. The first curved sliding groove 235a and the second curved sliding groove 235b meet to form a third recess 238c; and at the intersection, the first curved sliding groove 235a is higher than the second curved sliding groove 235b.

In an embodiment, the second arch sliding groove 236 includes a third curved sliding groove 236a and a fourth curved sliding groove 236b. The third curved sliding groove 236a and the fourth curved sliding groove 236b meet to form a fourth recess 238d, and at the intersection, the third curved sliding groove 236a is higher than the fourth curved sliding groove 236b.

In an embodiment, when the hook head 231b of the hook element 231 is located at the second recess 238b or the third sliding groove 237, the camera component 220 connected to the heart-shaped sliding groove 233 protrudes from the housing 210, which is the first state of the camera component 220.

Figure 3A:
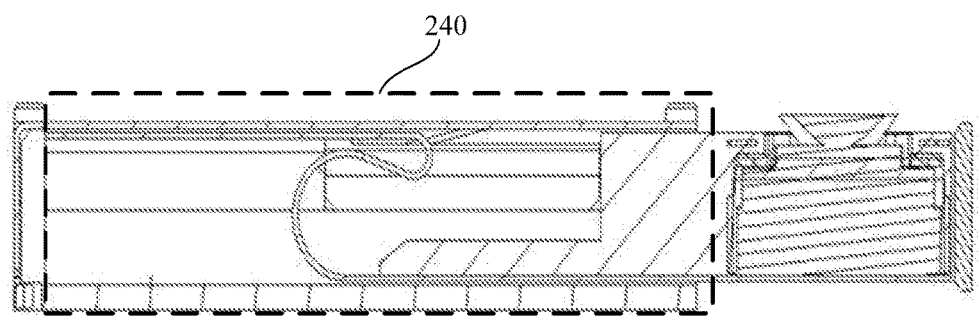
FIG. 3A is a schematic diagram illustrating a state of a camera assembly according to an exemplary embodiment.

In an embodiment, the flexible printed circuit board 240 is configured to be positioned between the camera component 220 and the inner surface of the housing 210 in a stretched state when the camera component 220 is in the first state, as shown in FIG. 3A.

In an embodiment, when the hook head 231b of the hook element 231 is located at the first recess 238a, the camera component 220 connected to the heart-shaped sliding groove 233 retracts inside the housing 210, which is the second state of the camera component 220.

Figure 3B:
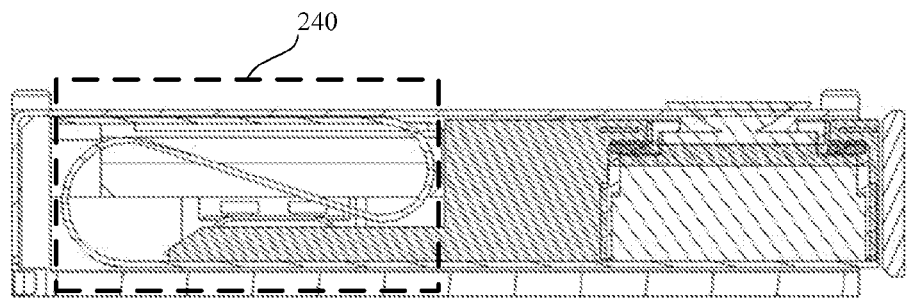
FIG. 3B is a schematic diagram illustrating a state of a camera assembly according to another exemplary embodiment.

In an embodiment, the flexible printed circuit board 240 is configured to be positioned between the camera component 220 and the inner surface of the housing 210 in a curled state when the camera component 220 is in the second state, as shown in FIG. 3B.

In an embodiment, the other end of the flexible printed circuit board 240 connected to the processor protrudes from a side of the housing 210 along a direction perpendicular to the sliding direction of the camera component 220. When the flexible printed circuit board 240 is positioned between the camera component 220 and the inner surface of the housing 210 in a stretched state or a curled state, the other end of the flexible printed circuit board connected to the processor is stationary.

The elastic component 232 is disposed between the housing 210 and the heart-shaped sliding groove 233.

In an embodiment, the elastic component 232 is disposed between the housing 210 and the tail end of the heart-shaped sliding groove 233, wherein the tail end of the heart-shaped sliding groove 233 is an end close to the tail ends of the first arch sliding groove 235 and the second arch sliding groove 236. When the hook head 231b of the hook element 231 is located at the second recess 238b or the third sliding groove 237, the camera component 220 is in the first state and the elastic component 232 is of the original length. When the hook head 231b of the hook element 231 is located at the first recess 238a, the camera component 220 is in the second state and the elastic component 232 is in a compressed state for providing a push force to the heart-shaped sliding groove 233 along the direction from the tail 231a to the hook head 231b of the hook element 231.

In an embodiment, the elastic component 232 is disposed between the housing 210 and the top end of the heart-shaped sliding groove 233, wherein the top end of the heart-shaped sliding groove 233 is an end close to the top ends of the first arch sliding groove 235 and the second arch sliding groove 236. When the hook head 231b of the hook element 231 is located at the second recess 238b or the third sliding groove 237, the camera component 220 is in the first state and the elastic component 232 is of the original length. When the hook head 231b of the hook element 231 is located at the first recess 238a, the camera component 220 is in the second state and the elastic component 232 is in a stretched state for providing a pull force to the heart-shaped sliding groove 233 along the direction from the tail 231a to the hook head 231b of the hook element 231.

The location of the elastic component 232 is not limited in this embodiment, and the elastic component 232 being disposed between the housing 210 and the tail end of the heart-shaped sliding groove 233 is taken as an example.

In an embodiment, the camera assembly 20 further includes a detection switch 270 secured to the housing 210.

In an embodiment, the flexible printed circuit board 240 further includes two contacts corresponding to the detection switch 270.

In an embodiment, the detection switch 270 is a metal plate including two resilient contacts which correspond to the two contacts on the flexible printed circuit board 240 respectively.

Figure 4:
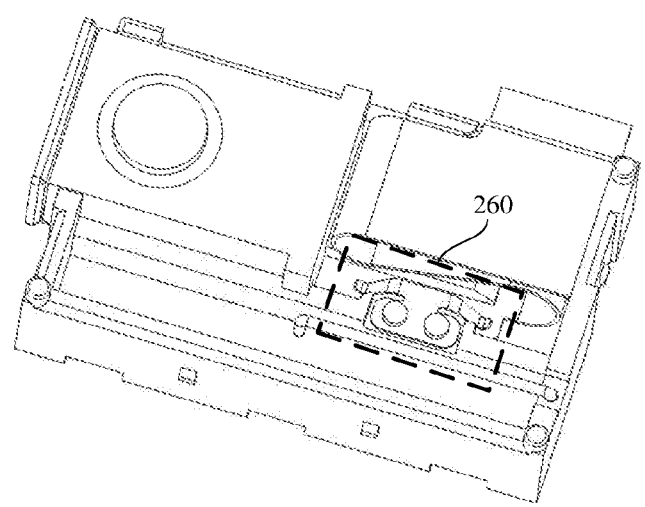
FIG. 4 is a schematic structural diagram of a camera assembly according to another exemplary embodiment.

In an embodiment, the detection switch 270 is configured to electrically connect the two contacts when the flexible printed circuit board 240 is in the curled state and the camera component 220 is in the second state, so as to trigger the flexible printed circuit board to send a camera assembly shutdown signal to the processor, so that the camera assembly 20 stops working, as shown in FIG. 4.

In an embodiment, the detection switch 270 is configured to electrically disconnect the two contacts when the flexible printed circuit board 240 is in the stretched state and the camera component 220 is in the first state, so as to trigger the flexible printed circuit board to send a camera assembly startup signal to the processor so that the camera assembly 20 works.

The camera component 220 is configured to, when receiving a press operation, switch between a first state of protruding from the housing 210 and a second state of retracting inside the housing 210 under the guidance of the PUSH-PUSH component 230.

In an embodiment, the camera component 220 is in a first state. The heart-shaped sliding groove 233 is configured to, after the camera component 220 receives a press operation, slide along the direction from the hook head 231b to the tail 231a of the hook element 231 under the driving of a press force of the press operation, so that the hook head 231b of the hook element 231 slides from the second recess 238b to the first recess along the first arch sliding groove to switch the camera component from the first state of protruding from the housing to the second state of retracting inside the housing.

In an embodiment, when the camera component 220 is in a first state, the hook head 231b of the hook element 231 is located at the second recess 238b or the third sliding groove 237. Since the second arch sliding groove 236 is higher than the first arch sliding groove 235 at the second recess 238b, after the camera component 220 receives a press operation, the heart-shaped sliding groove 233 slides along a direction from the hook head 231b to the tail 231a of the hook element 231, so that the hook head 231b slides to the third recess 238c along the first arch sliding groove 235. Since the first curved sliding groove 235a is higher than the second curved sliding groove 235b at the third recess 238c, the hook head 231b slides to the first recess 238a along the second curved sliding groove 235b and stays at the first recess 238a, so that the elastic component 232 is in a compressed state. Accordingly, the heart-shaped sliding groove 233 guides the camera component 220 to slide along the direction from the hook head 231b to the tail 231a of the hook element 231, and the camera component 220 switches to the second state of retracting inside the housing.

In another embodiment, the camera component 220 is in a second state. The heart-shaped sliding groove 233 is configured to, after the camera component 220 receives a press operation, slide along the direction from the tail 231a to the hook head 231b of the hook element 231 under the driving of the push force so that the hook head 231b of the hook element 231 slides from the first recess 238a to the second recess 238b along the second arch sliding groove 236 to switch the camera component 220 from the second state of retracting inside the housing to the first state of protruding from the housing.

In an embodiment, when the camera component 220 is in a second state, the hook head 231b of the hook element 231 is located at the first recess 238a. After the camera component 220 receives a press operation, the hook head 231b of the hook element 231 slides to the fourth recess 238d along the third curved sliding groove 236a. Since the third curved sliding groove 236a is higher than the fourth curved sliding groove 236b at the fourth recess 238b, the heart-shaped sliding groove 233 slides along the direction from the tail 231a to the hook head 231b under the driving of the push force of the elastic component 232, so that the hook head 231b slides to the second recess 238b along the fourth curved sliding groove 236b and continues to slide to the third sliding groove 237, such that the elastic component 232 returns to the original length. Accordingly, the heart-shaped sliding groove 233 guides the camera component 220 to slide along the direction from the tail 231a to the hook head 231b of the hook element 231, and the camera component 220 switches to the first state of protruding from the housing.

The camera assembly provided in the above embodiments of the present disclosure includes a housing, a camera component provided inside the housing and a press-type PUSH-PUSH component; one end of the PUSH-PUSH component is connected to the housing and the other end thereof is connected to the camera component; a sliding groove is formed inside the housing for the camera component to slide therealong; and the camera component is configured to, when receiving a press operation, switch between a first state of protruding from the housing and a second state of retracting inside the housing under the guidance of the PUSH-PUSH component. Thus, even if the camera assembly is provided on the back side of an electronic device and the back side of the electronic device often contacts a table, the lens of the camera assembly is not easy to be worn. That is, as the lens of the camera assembly in the above embodiments can be switched between protruding from the housing and retracting inside the housing, the wear and tear of the lens can be reduced.

Further, according to the camera assembly in the embodiments of the present disclosure, a camera assembly shutdown signal is sent when the camera component retracts inside the housing, and a camera assembly startup signal is sent when the camera component protrudes from the housing. Therefore, the usage of the camera assembly is not affected.

Figure 5:
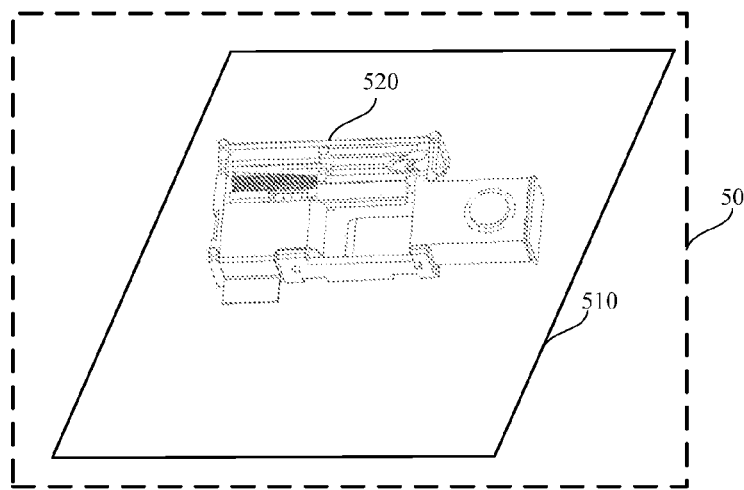
FIG. 5 is a schematic structural diagram of an electronic device according to an exemplary embodiment.

FIG. 5 is a schematic structural diagram of an electronic device according to another exemplary embodiment. As shown in FIG. 5, an electronic device 50 includes a main board 510 and a camera assembly 520.

In an embodiment, the camera assembly 520 is a camera assembly shown in any one of FIGS. 2 to 4, which will not be described redundantly in this embodiment.

In an embodiment, the camera assembly 500 is provided on the main board 510.

Figure 6:
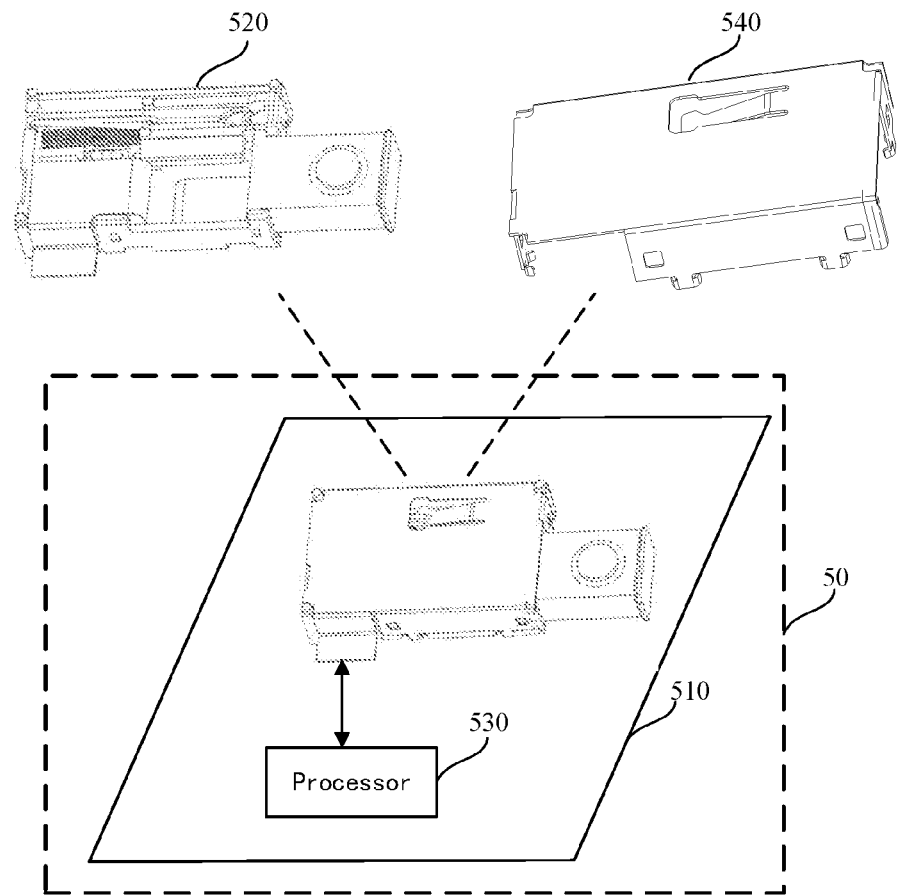
FIG. 6 is a schematic structural diagram of an electronic device according to another exemplary embodiment.

In other embodiments based on the above embodiments, the electronic device 50 further includes a processor 530 as shown in FIG. 6.

In an embodiment, the main board 510 is further provided with the processor 530 which is connected to the flexible printed circuit board in the camera assembly via a conductive wire on the main board 510.

In an embodiment, the processor 530 is configured to receive a camera assembly startup signal sent by the camera assembly 520 and start a camera application according to the camera assembly startup signal, or to receive a camera assembly shutdown signal sent by the camera assembly 520 and close the camera application according to the camera assembly shutdown signal.

In an embodiment, the electronic device 50 further includes an enclosure 540 which is provided with an opening for exposing the camera assembly 520.

The electronic device provided in the above embodiments of the present disclosure includes a main board, a camera assembly, a processor and an enclosure; the camera assembly and the processor are provided on the main board; the processor is connected to a flexible printed circuit board in the camera assembly via a conductive wire on the main board, and is configured to receive a camera assembly startup signal sent by the camera assembly and start a camera application according to the camera assembly startup signal or to receive a camera assembly shutdown signal sent by the camera assembly and close the camera application according to the camera assembly shutdown signal. Thus, even if the camera assembly is provided on the back side of an electronic device and the back side of the electronic device often contacts a table, the lens of the camera assembly is not easy to be worn. Further, the camera application is started when the lens of the camera component protrudes from the housing and is closed when the lens of the camera component retracts inside the housing. Thus, not only the usage of the camera assembly will not be affected but also the wear and tear of the lens can be reduced.

Other embodiments of the present disclosure will be apparent to those skilled in the art from consideration of the specification and practice of the present disclosure disclosed here. This application is intended to cover any variations, uses, or adaptations of the present disclosure following the general principles thereof and including such departures from the present disclosure as come within known or customary practice in the art. It is intended that the specification and embodiments be considered as exemplary only, with a true scope and spirit of the present disclosure being indicated by the appended claims.

It will be appreciated that the present disclosure is not limited to the exact construction that has been described above and illustrated in the accompanying drawings, and that various modifications and changes can be made without departing from the scope thereof. It is intended that the scope of the present disclosure only be limited by the appended claims.

What is claimed is:
1. A camera assembly, comprising:
a housing having a first sliding groove;
a camera component provided inside the housing and slidable along the first sliding groove, wherein the camera component is configured to switch between a first state and a second state by the guide of the PUSH-PUSH component when receiving a press operation; and
a press-type PUSH-PUSH component provided inside the housing, wherein both ends of the PUSH-PUSH component are connected to the housing and the camera component, respectively;
wherein the first state comprises protruding from the housing, and the second state comprises retracting inside the housing;
wherein the PUSH-PUSH component comprises:
 a heart-shaped sliding groove fixedly connected in parallel to the camera component, wherein the heart-shaped sliding groove comprises a heart-shaped closed sliding groove comprising:
  a first arch sliding groove having a first top end and a first tail end;
  a second arch sliding groove having a second top end and a second tail end that meet with the first top end and the first tail end respectively to form a first recess and a second recess;
 a hook element having a tail connected to the housing and a head disposed in the heart-shaped sliding groove;
 an elastic component disposed between the housing and the heart-shaped sliding groove, wherein the elastic component is configured to provide a push force to the heart-shaped sliding groove along a direction from the tail to the head; and wherein the heart-shaped sliding groove is configured to slide along the direction from the tail to the head of the hook element or from the head to the tail of the hook element.

2. The camera assembly according to claim 1, wherein the heart-shaped sliding groove is configured to slide along the direction from the tail to the head of the hook element under the driving of the push force after the camera component receives a press operation, so that the head of the hook element slides from the first recess to the second recess along the second arch sliding groove to switch the camera component from the second state to the first state.

3. The camera assembly according to claim 2, wherein the housing comprises a second sliding groove and the heart-shaped sliding groove is slidable along the second sliding groove.

4. The camera assembly according to claim 2, wherein the elastic component is a spring.

5. The camera assembly according to claim 1, wherein the heart-shaped sliding groove is configured to slide along a direction from the head to the tail of the hook element under the driving of a press force of the press operation after the camera component receives a press operation, so that the head of the hook element slides from the second recess to the first recess along the first arch sliding groove to switch the camera component from the first state to the second state.

6. The camera assembly according to claim 1, further comprising:
a flexible printed circuit board having two ends electrically connected to the camera component and a processor, respectively, wherein the flexible printed circuit board is configured to be positioned between the camera component and an inner surface of the housing in a curled state when the camera component is in the second state and to be positioned between the camera component and the inner surface of the housing in a stretched state when the camera component is in the first state.

7. The camera assembly according to claim 6, further comprising:
a detection switch secured to the housing and corresponding to two contacts of the flexible printed circuit board, wherein the detection switch is configured to electrically connect the two contacts when the flexible printed circuit board is in the curled state to trigger the flexible printed circuit board to send a camera assembly shutdown signal to the processor.

8. The camera assembly according to claim 7, wherein the detection switch is a metal plate comprising two resilient contacts which correspond to the two contacts of the flexible printed circuit board respectively.

9. The camera assembly according to claim 6, further comprising:
a detection switch secured to the housing and corresponding to two contacts of the flexible printed circuit board, wherein the detection switch is configured to electrically disconnect the two contacts when the flexible printed circuit board is in the stretched state to trigger the flexible printed circuit board to send a camera assembly startup signal to the processor.

10. An electronic device, comprising:
a main board; and
a camera assembly provided on the main board, wherein the camera assembly comprises:
a housing having a first sliding groove;
a camera component provided inside the housing and slidable along the first sliding groove, wherein the camera component is configured to switch between a first state and a second state by the guide of the PUSH-PUSH component when receiving a press operation; and
a press-type PUSH-PUSH component provided inside the housing, wherein both ends of the PUSH-PUSH component are connected to the housing and the camera component, respectively:
wherein the first state comprises protruding from the housing, and the second state comprises retracting inside the housing;
wherein the PUSH-PUSH component comprises:
a heart-shaped sliding groove fixedly connected in parallel to the camera component, wherein the heart-shaped sliding groove comprises a heart-shaped closed sliding groove comprising:
a first arch sliding groove having a first top end and a first tail end;
a second arch sliding groove having a second top end and a second tail end that meet with the first top end and the first tail end respectively to form a first recess and a second recess;
a hook element having a tail connected to the housing and a head disposed in the heart-shaped sliding groove;
an elastic component disposed between the housing and the heart-shaped sliding groove, wherein the elastic component is configured to provide a push force to the heart-shaped sliding groove along a direction from the tail to the head; and
wherein the heart-shaped sliding groove is configured to slide along the direction from the tail to the head of the hook element or from the head to the tail of the hook element.

11. The electronic device according to claim 10, wherein the heart-shaped sliding groove is configured to slide along the direction from the tail to the head of the hook element under the driving of the push force after the camera component receives a press operation, so that the head of the hook element slides from the first recess to the second recess along the second arch sliding groove to switch the camera component from the second state to the first state.

12. The electronic device according to claim 11, wherein the housing comprises a second sliding groove and the heart-shaped sliding groove is slidable along the second sliding groove.

13. The electronic device according to claim 11, wherein the elastic component is a spring.

14. The electronic device according to claim 10, wherein the heart-shaped sliding groove is configured to slide along a direction from the head to the tail of the hook element under the driving of a press force of the press operation after the camera component receives a press operation, so that the head of the hook element slides from the second recess to the first recess along the first arch sliding groove to switch the camera component from the first state to the second state.

15. The electronic device according to claim 10, further comprising:
a flexible printed circuit board having two ends electrically connected to the camera component and a processor, respectively, wherein the flexible printed circuit board is configured to be positioned between the camera component and an inner surface of the housing in a curled state when the camera component is in the second state and to be positioned between the camera component and the inner surface of the housing in a stretched state when the camera component is in the first state.

16. The electronic device according to claim 15, further comprising:
a detection switch secured to the housing and corresponding to two contacts of the flexible printed circuit board, wherein the detection switch is configured to electrically connect the two contacts when the flexible printed circuit board is in the curled state to trigger the flexible printed circuit board to send a camera assembly shutdown signal to the processor.

17. The electronic device according to claim 16, wherein the detection switch is a metal plate comprising two resilient contacts which correspond to the two contacts of the flexible printed circuit board respectively.

18. The electronic device according to claim 17, wherein the main board comprises:
a processor connected to the flexible printed circuit board in the camera assembly via a conductive wire on the main board, wherein the processor is configured to receive a camera assembly startup signal sent by the camera assembly and start a camera application according to the camera assembly startup signal.

19. The electronic device according to claim 15, further comprising:
a detection switch secured to the housing and corresponding to two contacts of the flexible printed circuit board, wherein the detection switch is configured to electrically disconnect the two contacts when the flexible printed circuit board is in the stretched state to trigger the flexible printed circuit board to send a camera assembly startup signal to the processor.

20. The electronic device according to claim 10, further comprising an enclosure provided with an opening for exposing the camera assembly.

* * * * *